United States Patent [19]
Bete

[11] 4,378,586
[45] Mar. 29, 1983

[54] PROTECTIVE CIRCUITRY FOR SEMICONDUCTOR SWITCHES

[75] Inventor: Manfred Bete, Erlangen, Fed. Rep. of Germany

[73] Assignee: Siemens Aktiengesellschaft, Berlin & Munich, Fed. Rep. of Germany

[21] Appl. No.: 235,677

[22] Filed: Feb. 18, 1981

[30] Foreign Application Priority Data

Feb. 28, 1980 [DE] Fed. Rep. of Germany ....... 3007597

[51] Int. Cl.³ ............................................ H02H 7/122
[52] U.S. Cl. ...................................... 363/56; 361/91; 361/100; 363/19
[58] Field of Search ................... 361/91, 111, 88, 100, 361/101; 363/18, 19, 56, 124

[56] References Cited

U.S. PATENT DOCUMENTS 4,261,032  4/1981  Cavigelli ............................... 363/19

FOREIGN PATENT DOCUMENTS 1956145  5/1971  Fed. Rep. of Germany ........ 363/56

OTHER PUBLICATIONS

"Thyristoren", B. G. Teubner Stuttgart, 1974, p. 41.

*Primary Examiner*—Reinhard J. Eisenzopf
*Attorney, Agent, or Firm*—Kenyon & Kenyon

[57] ABSTRACT

A circuit for protecting a semiconductor switch which connects an inductive load to a voltage supply. The switch is shunted by the series combination of a diode and a capacitor. The capacitor is connected to the input terminals of flyback converter, the converter having a control input terminal for receiving a control signal which also controls the conduction state of the semiconductor switch. The electrical energy which is provided at output terminals of the protective circuit may be advantageously returned to the voltage supply so as to reduce to a minimum the electrical energy dissipated in the protective circuit, or, alternatively, such energy may be available for any desired use, illustratively, as an auxiliary power supply.

2 Claims, 2 Drawing Figures

PROTECTIVE CIRCUITRY FOR SEMICONDUCTOR SWITCHES

BACKGROUND OF THE INVENTION

This invention relates to protective circuitry for semiconductor switching devices, and more particularly to a protective circuit for a switching transistor which connects an inductive load to a voltage supply.

A protective circuit which connects an inductive load to a voltage supply, and which is shunted by a diode in series with a capacitor, is described in German reference DE-AS No. 19 56 145. In that reference, each switching transistor is connected in a shunt configuration with a series combination of a diode and a capacitor, for protecting inductively loaded switching transistors in electronic push-pull converters. The capacitor serves to protect the electronic switch from overvoltages which occur when the inductive load is disconnected. The diode is shunted by a transistor which is switched into a conductive state during the time that the transistor to be protected is in a nonconductive state. During such time as the shunt transistor is in a nonconductive state, the charge on the capacitor which is accummulated as a result of the switching transistor being switched off is discharged back into the voltage supply by means of a primary winding of a converter transformer. Thus, a portion of the capacitor discharge energy is conducted to the voltage supply, and a further portion is delivered to the output circuit of the converter.

In the above-described prior art circuit arrangement, the capacitor can be discharged only to the voltage level of the input voltage. During the time that the shunt transistor is in a nonconductive state, the voltage thereacross rises to at least the value of the input voltage. Thus, when the transistor becomes conductive once again, it experiences considerable stress because it must conduct a considerable current at a relatively high voltage, thereby requiring a relatively large power dissipation. Such a disadvantageous power dissipation requirement results from the fact that the capacitor discharge energy, in this prior art circuit arrangement, can be conducted only to either the voltage supply, or to the output circuit of the converter. No other utilization of the dischage energy is possible with this circuit.

It is, therefore, an object of this invention to provide a protective circuit for a switching transistor which connects an inductive load to a voltage supply, whereby the discharge energy of a capacitor can be used in any manner desired.

SUMMARY OF THE INVENTION

The foregoing and other objects are achieved by this invention which provides a protective circuit arrangement for a semiconductor switch which connects an inductive load to a voltage supply, the semiconductor switch being shunted by a diode and a capacitor, so as to form a circuit arrangement which transfers electrical energy stored in the capacitor in response to control signals. The capacitor is further coupled to the input of a flyback converter which is further provided with a control input terminal for receiving the control signals.

It is a feature of this invention that the capacitor can be discharged to a voltage of nearly zero. Thus, as the semiconductor switch is being switched-off, only a small voltage is present across the capacitor, such a small voltage increasing only after the current through the semiconductor switch has become small. In this manner, the power dissipation in the semiconductor switch during the switching-off process is kept small. The output voltage of the flyback converter, which is supplied by the discharge energy of the capacitor, may be utilized in any desired manner. For example, such as output voltage may be used as an auxiliary voltage source.

In one embodiment, a bypass diode is advantageously connected in a shunt configuration with the capacitor. The bypass diode functions to conduct current through the primary winding of the transformer in the flyback converter when the voltage across the capacitor begins to reverse itself, and thereby bias the diode for forward conduction. This prevents the capacitor from becoming charged to a negative voltage value, and thereby avoids a stressful reverse bias from being applied to the semiconductor switch.

BRIEF DESCRIPTION OF THE DRAWINGS

Comprehension of the invention is facilitated by reading the following detailed description in conjunction with the annexed drawings, in which.

DETAILED DESCRIPTION

Figure 1:
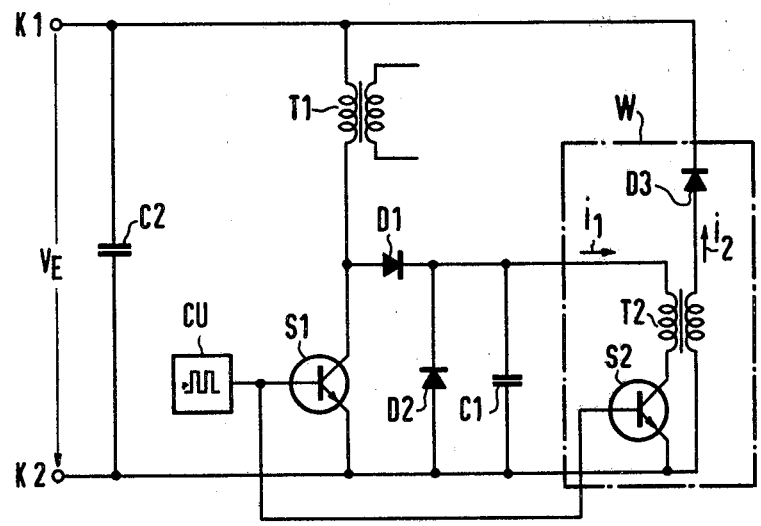
FIG. 1 is a schematic representation of a protective circuit for a semiconductor switch, constructed in accordance with the principles of the invention.

The schematic diagram of FIG. 1 shows a switching transistor S1 which is employed as a semiconductor switch in a pulsed power supply. Switching transistor S1 is connected with a primary winding of transformer T1 across a pair of input terminals, K1 and K2, across which is placed a voltage $V_E$. The switching transistor is coupled at its base terminal to a control unit CU. Input voltage $V_E$ is smoothened by a smoothing capacitor C2 which is connected across the input terminals. The collector terminal of switching transistor S1 is connected to the anode terminal of a diode D1, the diode being connected at its cathode terminal to the parallel combination of a diode D2 and a capacitor C1, to a reference potential at input terminal K2. Capacitor C1 is shunted by the series combination of a primary winding of a transformer T2 and a second transistor S2. Second transistor S2 is connected at its base terminal to control unit CU. The secondary winding of transformer T2 is connected at one end to the anode of a diode D3 which is connected at its cathode to input terminal K1, and at its other end directly to input terminal K2. The circuit elements consisting of second transistor S2, transformer T2 and diode D3, which are contained within box W, form a flyback converter.

At such time as switching transistor S1 enters a nonconductive state, the current flowing through the primary winding of transformer T1 is initially maintained by the inductive characteristic of the primary winding, and flows through diode D1 so as to charge capacitor C1. Since switching transistor S1 and second transistor S2 are simultaneously nonconductive, current does not flow through the primary winding of transformer T2 of flyback converter W. When transistors S1 and S2 become conductive once again, capacitor C1 is discharged through the primary winding of transformer of T2 and transistor S2. This causes magnetic energy to be stored in transformer T2. Capacitor C1 is prevented from discharging through switching transistor S1, which is in a conductive state, by diode D1 which is reverse-biased. During the time that transistors S1 and S2 are nonconductive, the magnetic energy which is stored in transformer T2 is conducted to the voltage supply through diode D3.

Diode D2 which is shunted across capacitor C1 prevents the capacitor from reversing the polarity of its voltage during its discharge through the primary winding of transformer T2. If diode D2 where not present in the circuit, the inductive effect of the primary winding of transformer T2 would cause primary current $i_1$ to continue to flow at its original magnitude so as to not only discharge capacitor C1, but charge capacitor C1 with opposite polarity voltage. Such negative voltage would stress transistor S1 in the reverse-biased direction. Such a reversal of the polarity of the voltage across capacitor C1 is prevented by bypass diode D2. Thus, after capacitor C1 discharged, primary current $i_1$ flows through diode D2.

Figure 2:
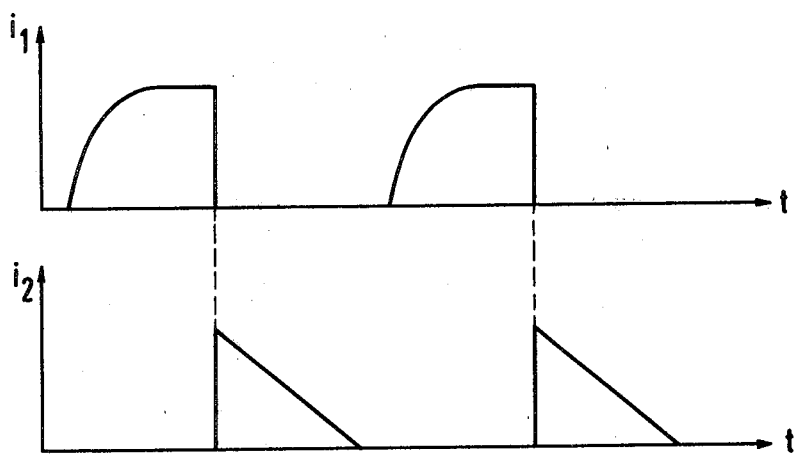
FIG. 2 shows current wave forms which are useful for explaining the operation of the embodiment of FIG. 1.

FIG. 2 shows the wave forms of currents $i_1$ and $i_2$, which are the primary and secondary winding currents, respectively, of flyback converter transformer T2. As shown in the diagram, current $i_1$ which is generated by capacitor C1 begins to rise in magnitude as transistors S1 and S2 become conductive. Current $i_1$ is sharply terminated when transistors S1 and S2 are cut-off. At this moment, secondary current $i_2$ is induced in the secondary winding of transformer T2, and decays as the magnetic energy stored in transformer T2 is dissipated.

It should be noted that, in the specific illustrative embodiment, the magnetizing energy of transformer T1 which is stored in capacitor C1 when transistor S1 is in a nonconductive state, is not dissipated in a resistor as in known circuits. In contrast to such known circuits, the magnetizing energy in the illustrative embodiment is conducted back to the voltage supply. This results in a considerable reduction in the dissipation loss, the dissipation loss becoming more important as the input voltage of the circuit and the switching frequency are increased.

In some embodiments of the invention, the energy which is recovered from capacitor C1 by the flyback converter need not be returned to the voltage supply, but may be utilized, for example, as an auxiliary power supply for a control circuit. Persons skilled in the pertinent art can devise, in light of this teaching, a circuit arrangement having the advantages described hereinabove for any type of switch which controls the current through an inductive load.

Although the inventive concept disclosed herein is described in terms of a specific embodiment and particular applications, persons skilled in the art can generate additional embodiments without departing from the spirit or exceeding the scope of the claimed invention. It is to be remembered, therefore, that the drawings and descriptions in this disclosure are illustrative of the invention and should not be construed to limit the scope thereof.

What is claimed is:

1. A circuit arrangement for protecting a switch which connects an inductive load to a voltage supply, the switch being responsive to a control signal and shunted by a diode and a capacitor, the circuit arrangement further comprising flyback converter means having input terminals connected to the capacitor, and a control input terminal for receiving the control signal.

2. The circuit arrangement of claim 1 wherein there is further provided bypass diode means connected in shunt across the capacitor.

* * * * *